United States Patent
Nishimuta

(10) Patent No.: US 11,342,880 B2
(45) Date of Patent: May 24, 2022

(54) CAPACITOR CAPACITANCE ESTIMATION DEVICE, CONTROL SYSTEM, AND CAPACITOR CAPACITANCE ESTIMATION METHOD

(71) Applicant: Mitsubishi Electric Corporation, Tokyo (JP)

(72) Inventor: Izaya Nishimuta, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 92 days.

(21) Appl. No.: 17/049,575

(22) PCT Filed: Jun. 13, 2018

(86) PCT No.: PCT/JP2018/022541
§ 371 (c)(1),
(2) Date: Oct. 22, 2020

(87) PCT Pub. No.: WO2019/239511
PCT Pub. Date: Dec. 19, 2019

(65) Prior Publication Data
US 2021/0242818 A1    Aug. 5, 2021

(51) Int. Cl.
*H02P 29/024* (2016.01)
*G01R 27/26* (2006.01)
(Continued)

(52) U.S. Cl.
CPC ........ *H02P 29/026* (2013.01); *G01R 27/2605* (2013.01); *H02P 23/12* (2013.01); *H02P 27/08* (2013.01)

(58) Field of Classification Search
CPC ........ H02P 29/026; H02P 23/12; H02P 27/08; G01R 27/2605
See application file for complete search history.

(56) References Cited

U.S. PATENT DOCUMENTS

2011/0018555 A1  1/2011  Meijer et al.
2014/0328091 A1*  11/2014  Sakakibara ............. H02M 1/15
                                                            363/37
(Continued)

FOREIGN PATENT DOCUMENTS

JP      59-187272 A    10/1984
JP       3-46572 A     2/1991
(Continued)

OTHER PUBLICATIONS

International Search Report and Written Opinion dated Jul. 10, 2018 for PCT/JP2018/022541 filed on Jun. 13, 2018, 8 pages including English Translation of the International Search Report.

*Primary Examiner* — Zoheb S Imtiaz
(74) *Attorney, Agent, or Firm* — Xsensus LLP

(57) ABSTRACT

A capacitor capacitance estimation device including processing circuitry to segment a section signal into a plurality of signals and to generate a plurality of pieces of frequency domain data by converting each of the plurality of signals obtained by the segmentation into a plurality of component values in a frequency domain. Each of the plurality of signals having a predetermined duration. The processing circuitry further configured to extract a component value of a frequency corresponding to a carrier frequency from the plurality of component values in each of the plurality of pieces of frequency domain data, to use the extracted component value as a value at time corresponding to the corresponding one of the extracted signals, and to generate time-series data representing a plurality of the extracted component values in a time series, to estimate a capacitance of a capacitor from processed and filtered time-series data.

12 Claims, 11 Drawing Sheets

(51) Int. Cl.
*H02P 23/12* (2006.01)
*H02P 27/08* (2006.01)

(56) References Cited

U.S. PATENT DOCUMENTS

2016/0254783 A1* 9/2016 Unru .................. H02S 50/00
                                                  324/658
2021/0249979 A1* 8/2021 Dinu .................. H02P 27/12

FOREIGN PATENT DOCUMENTS

JP          11-160377 A      6/1999
JP          2010-515048 A    5/2010

* cited by examiner

CAPACITOR CAPACITANCE ESTIMATION DEVICE, CONTROL SYSTEM, AND CAPACITOR CAPACITANCE ESTIMATION METHOD

CROSS-REFERENCE TO RELATED APPLICATION

The present application is based on PCT filing PCT/JP2018/022541, filed Jun. 13, 2018, the entire contents of which are incorporated herein by reference.

TECHNICAL FIELD

The present invention relates to a capacitor capacitance estimation device, an automobile control system, a factory automation (FA) system and a capacitor capacitance estimation method.

BACKGROUND ART

In recent years, high technology of advanced driving control systems, such as automated driving or electric vehicles, and production automation by means of FA is developing, and the maintenance of equipment constituting a part of such technology is becoming increasingly important. Also for the purpose of increasing the availability factor of such equipment, maintenance by means of condition monitoring, which monitors the equipment on a real-time basis and acquires a sign of a problem such as deterioration or failure before the problem occurs, is being required.

As one of technologies for performing such condition monitoring maintenance, a condition monitoring technique in regard to a smoothing capacitor for smoothing power supply voltage that has been rectified from AC voltage to DC voltage has been devised. This condition monitoring technique monitors the capacitance of the capacitor and estimates a capacitance decrement due to aging deterioration of the capacitor.

In diagnosing the deterioration of the capacitor by monitoring the capacitance of the capacitor on a real-time basis, in order to ensure the accuracy of the diagnosis, it is necessary to perform the estimation of the capacitance in consideration of fluctuation in a load connected to the equipment.

In Patent Reference 1, for example, in a circuit made up by a converter that generates variable DC current, an inverter that generates variable-frequency electric power and supplies the variable-frequency electric power to a motor, and a capacitor installed for smoothing variable DC voltage, the monitoring of the capacitance deterioration of the capacitor is carried out on a real-time basis by making a threshold judgment on a peak hold value of ripple voltage in the end-to-end voltage of the capacitor at certain time intervals.

Further, in order to perform the estimation in consideration of the load on the motor, the Patent Reference 1 employs a method in which load current of the motor is measured, a change in the load current and a threshold value are previously associated with each other, and the threshold judgment is made by referring to the load current and using a corresponding threshold value.

PRIOR ART REFERENCE

Patent Reference

Patent Reference 1: Japanese Patent Application Publication No. 11-160377

SUMMARY OF THE INVENTION

Problem to be Solved by the Invention

However, the Patent Reference 1 uses a value obtained by differentiating the ripple voltage in the end-to-end voltage of the capacitor as a feature quantity for the judgment on the deterioration. Accordingly, there is a problem in that it is necessary to measure the load current of the motor separately from the capacitance measurement in order to take into consideration a change in the feature quantity due to the fluctuation in the load.

It is therefore an object of one or more aspects of the present invention to make it possible to monitor the capacitance of a capacitor without the need of measuring a physical quantity corresponding to the load.

Means for Solving the Problem

A capacitor capacitance estimation device according to an aspect of the present invention is a capacitor capacitance estimation device configured to estimate capacitance of a capacitor in an equipment system including a power supply, the capacitor to smooth DC voltage from the power supply, an inverter to receive a supply of the smoothed DC voltage and to generate AC voltage, and electric equipment to operate by receiving a supply of the AC voltage, including: a filter design unit configured to generate a filter for removing influence of fluctuation based on a load fluctuation cycle that is a cycle of the fluctuation of a load placed on the electric equipment; a section signal acquisition unit configured to acquire a section signal of a predetermined period from an input signal that includes a carrier frequency included in the AC voltage as a component, the carrier frequency being in sync with a pulse width modulation (PWM) signal for controlling the inverter; a frequency domain conversion unit configured to segment the section signal into a plurality of signals and to generate a plurality of pieces of frequency domain data by converting each of the plurality of signals obtained by the segmentation into a plurality of component values in a frequency domain, each of the plurality of signals having predetermined duration; a carrier frequency component extraction unit configured to extract a component value of a frequency corresponding to the carrier frequency from the plurality of component values in each of the plurality of pieces of frequency domain data, to use the extracted component value as a value at time corresponding to the corresponding one of the extracted signals, and to generate time-series data representing a plurality of the extracted component values in a time series; a filter application unit configured to generate processed time-series data by applying the filter to the time-series data; and a capacitor capacitance estimation unit configured to estimate the capacitance of the capacitor from the processed time-series data.

An automobile control system according to an aspect of the present invention is an automobile control system including a motor system, equipment to operate by receiving a supply of motive power from the motor system, and a capacitor capacitance estimation device, wherein the motor system includes: a power supply; a capacitor to smooth DC voltage from the power supply; an inverter to receive a supply of the smoothed DC voltage and to generate AC voltage; and a motor to be driven by receiving a supply of the AC voltage, and the capacitor capacitance estimation device includes: a filter design unit configured to generate a filter for removing influence of fluctuation based on a load fluctuation cycle that is a cycle of the fluctuation of a load placed on the motor; a section signal acquisition unit configured to acquire a section signal of a predetermined period from an input signal that includes a carrier frequency included in the AC voltage as a component, the carrier frequency being in sync with a pulse width modulation (PWM) signal for controlling the inverter; a frequency domain conversion unit configured to segment the section signal into a plurality of signals and to generate a plurality of pieces of frequency domain data by converting each of the plurality of signals obtained by the segmentation into a plurality of component values in a frequency domain, each of the plurality of signals having predetermined duration; a carrier frequency component extraction unit configured to extract a component value of a frequency corresponding to the carrier frequency from the plurality of component values in each of the plurality of pieces of frequency domain data, to use the extracted component value as a value at time corresponding to the corresponding one of the extracted signals, and to generate time-series data representing a plurality of the extracted component values in a time series; a filter application unit configured to generate processed time-series data by applying the filter to the time-series data; and a capacitor capacitance estimation unit configured to estimate the capacitance of the capacitor from the processed time-series data.

An FA system according to an aspect of the present invention is an FA (Factory Automation) system including a motor system, equipment to operate by receiving a supply of motive power from the motor system, and a capacitor capacitance estimation device, wherein the motor system includes: a power supply; a capacitor to smooth DC voltage from the power supply; an inverter to receive a supply of the smoothed DC voltage and to generate AC voltage; and a motor to be driven by receiving a supply of the AC voltage, and the capacitor capacitance estimation device includes: a filter design unit configured to generate a filter for removing influence of fluctuation based on a load fluctuation cycle that is a cycle of the fluctuation of a load placed on the motor; a section signal acquisition unit configured to acquire a section signal of a predetermined period from an input signal that includes a carrier frequency included in the AC voltage as a component, the carrier frequency being in sync with a pulse width modulation (PWM) signal for controlling the inverter; a frequency domain conversion unit configured to segment the section signal into a plurality of signals and to generate a plurality of pieces of frequency domain data by converting each of the plurality of signals obtained by the segmentation into a plurality of component values in a frequency domain, each of the plurality of signals having predetermined duration; a carrier frequency component extraction unit configured to extract a component value of a frequency corresponding to the carrier frequency from the plurality of component values in each of the plurality of pieces of frequency domain data, to use the extracted component value as a value at time corresponding to the corresponding one of the extracted signals, and to generate time-series data representing a plurality of the extracted component values in a time series; a filter application unit configured to generate processed time-series data by applying the filter to the time-series data; and a capacitor capacitance estimation unit configured to estimate the capacitance of the capacitor from the processed time-series data.

A capacitor capacitance estimation method according to an aspect of the present invention is a capacitor capacitance estimation method of estimating capacitance of a capacitor in an equipment system including a power supply, the capacitor to smooth DC voltage from the power supply, an inverter to receive a supply of the smoothed DC voltage and to generate AC voltage, and electric equipment to operate by receiving a supply of the AC voltage, including: generating a filter for removing influence of fluctuation based on a load fluctuation cycle that is a cycle of the fluctuation of a load placed on the electric equipment; acquiring a section signal of a predetermined period from an input signal that includes a carrier frequency included in the AC voltage as a component, the carrier frequency being in sync with a pulse width modulation (PWM) signal for controlling the inverter; segmenting the section signal into a plurality of signals and generating a plurality of pieces of frequency domain data by converting each of the plurality of signals obtained by the segmentation into a plurality of component values in a frequency domain, each of the plurality of signals having predetermined duration; extracting a component value of a frequency corresponding to the carrier frequency from the plurality of component values in each of the plurality of pieces of frequency domain data, using the extracted component value as a value at time corresponding to the corresponding one of the extracted signals, and generating time-series data representing a plurality of the extracted component values in a time series; generating processed time-series data by applying the filter to the time-series data; and estimating the capacitance of the capacitor from the processed time-series data.

Effect of the Invention

According to one or more aspects of the present invention, the capacitance of a capacitor can be monitored without the need of measuring a physical quantity corresponding to the load.

MODE FOR CARRYING OUT THE INVENTION

First Embodiment

Figure 1:
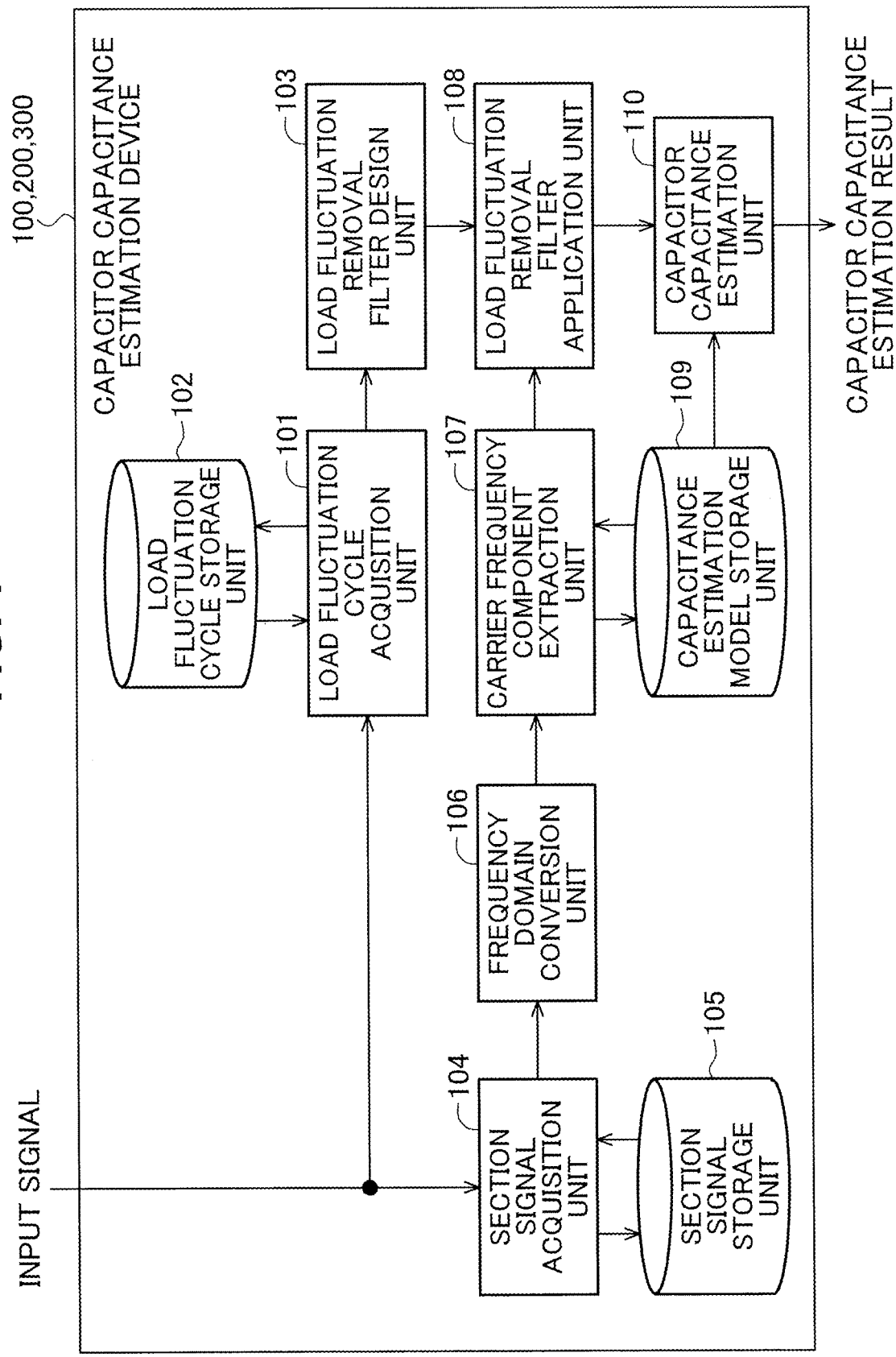
FIG. 1 is a block diagram schematically representing the configuration of capacitor capacitance estimation devices according to first to third embodiments.

FIG. 1 is a block diagram schematically representing the configuration of a capacitor capacitance estimation device 100 according to a first embodiment.

The capacitor capacitance estimation device 100 includes a load fluctuation cycle acquisition unit 101, a load fluctuation cycle storage unit 102, a load fluctuation removal filter design unit 103, a section signal acquisition unit 104, a section signal storage unit 105, a frequency domain conversion unit 106, a carrier frequency component extraction unit 107, a load fluctuation removal filter application unit 108, a capacitance estimation model storage unit 109 and a capacitor capacitance estimation unit 110.

The load fluctuation cycle acquisition unit 101 acquires a load fluctuation cycle from an input signal. The load fluctuation cycle is the cycle of fluctuation in a load placed on a motor which will be described later. For example, the load fluctuation cycle acquisition unit 101 receives a signal representing capacitor voltage which will be described later as the input signal and calculates the load fluctuation cycle of the signal. Alternatively, the load fluctuation cycle acquisition unit 101 acquires the load fluctuation cycle by reading out a load fluctuation cycle previously stored in the load fluctuation cycle storage unit 102. The acquired load fluctuation cycle is supplied to the load fluctuation removal filter design unit 103.

The load fluctuation cycle storage unit 102 stores the load fluctuation cycle. The load fluctuation cycle stored in the load fluctuation cycle storage unit 102 may be either calculated by the load fluctuation cycle acquisition unit 101 or previously stored.

The load fluctuation removal filter design unit 103 is a filter design unit that generates a filter for removing the influence of the fluctuation in the load, that is, a filter for removing short-term signal fluctuation due to the load fluctuation, based on the load fluctuation cycle supplied from the load fluctuation cycle acquisition unit 101. Specifically, the load fluctuation removal filter design unit 103 generates a filter that lets through signals at frequencies lower than a frequency corresponding to the load fluctuation cycle supplied from the load fluctuation cycle acquisition unit 101.

The section signal acquisition unit 104 receives a signal representing the capacitor voltage as an input signal and acquires a signal corresponding to the length of a time interval of estimating the capacitance of a capacitor which will be described later as a section signal. For example, the section signal acquisition unit 104 buffers the input signal in the section signal storage unit 105, and when the input signal regarding a predetermined period has been buffered, supplies the buffered input signal to the frequency domain conversion unit 106 as the section signal.

The section signal storage unit 105 stores the section signal.

The frequency domain conversion unit 106 segments the section signal supplied from the section signal acquisition unit 104 into a plurality of signals and generates a plurality of pieces of frequency domain data by converting each of the plurality of signals into a plurality of component values in the frequency domain. For example, the frequency domain conversion unit 106 generates a three-dimensional frequency spectrogram as frequency domain data by performing frequency conversion on the section signal supplied from the section signal acquisition unit 104. The component values mentioned here are frequency bins after performing the frequency conversion on the signal.

The carrier frequency component extraction unit 107 extracts a component value of a frequency corresponding to a carrier frequency from the plurality of component values in each of the plurality of pieces of frequency domain data generated by the frequency domain conversion unit 106, uses the extracted component value as a value at time corresponding to the corresponding signal, and thereby generates time-series data representing a plurality of the extracted component values in a time series. Specifically, the carrier frequency component extraction unit 107 extracts components of frequencies corresponding to the carrier frequency of a pulse width modulation (PWM) signal of an inverter 153 from the frequency spectrogram supplied from the frequency domain conversion unit 106 and generates time-series data of carrier frequency components in a period corresponding to the corresponding section signal. The carrier frequency is the frequency of ON-OFF switching of switching elements of the inverter, and is in sync with the PWM signal.

The load fluctuation removal filter application unit 108 is a filter application unit that applies the filter generated by the load fluctuation removal filter design unit 103 to the time-series data and thereby generates processed time-series data. Specifically, the load fluctuation removal filter application unit 108 receives the filter generated by the load fluctuation removal filter design unit 103 and the time-series data of the carrier frequency components extracted by the carrier frequency component extraction unit 107 and applies the filter to the time-series data. The time-series data after the application of the filter represents values obtained by removing the influence of the short-term signal fluctuation due to the load fluctuation from the component values extracted by the carrier frequency component extraction unit 107.

The capacitance estimation model storage unit 109 stores an estimation model learned with training data generated by using values constituting the time-series data of the carrier frequency components generated by the carrier frequency component extraction unit 107 as feature values.

The capacitor capacitance estimation unit 110 receives the supply of the time-series data after the application of the filter from the load fluctuation removal filter application unit 108 and estimates the capacitor capacitance by using values constituting the time-series data as feature values.

Figure 2A:
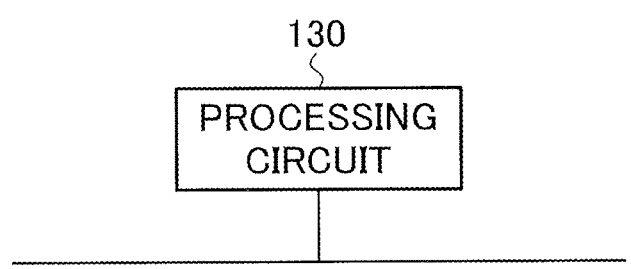
FIGS. 2A and 2B are block diagrams representing hardware configuration examples.

Part or all of the load fluctuation cycle acquisition unit 101, the load fluctuation removal filter design unit 103, the section signal acquisition unit 104, the frequency domain conversion unit 106, the carrier frequency component extraction unit 107, the load fluctuation removal filter application unit 108 and the capacitor capacitance estimation unit 110 described above can be implemented by a processing circuit 130 such as a single circuit, a combined circuit, a programmed processor, a parallelly programmed processor, an application specific integrated circuit (ASIC) or a field programmable gate array (FPGA) as shown in FIG. 2A, for example.

Figure 2B:
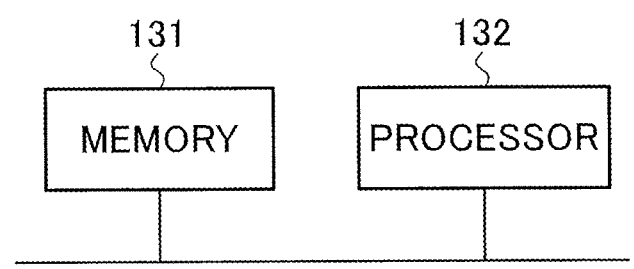

Further, part or all of the load fluctuation cycle acquisition unit 101, the load fluctuation removal filter design unit 103, the section signal acquisition unit 104, the frequency domain conversion unit 106, the carrier frequency component extraction unit 107, the load fluctuation removal filter application unit 108 and the capacitor capacitance estimation unit 110 can be implemented by a memory 131 and a processor 132 such as a central processing unit (CPU) for executing a program stored in the memory 131 as shown in FIG. 2B, for example. Such a program may be provided via a network, or provided in the form of being stored in a record medium. Namely, such a program may be provided as a program product, for example.

Incidentally, the load fluctuation cycle storage unit 102, the section signal storage unit 105 and the capacitance estimation model storage unit 109 can be implemented by a volatile memory or a nonvolatile memory.

Figure 3:
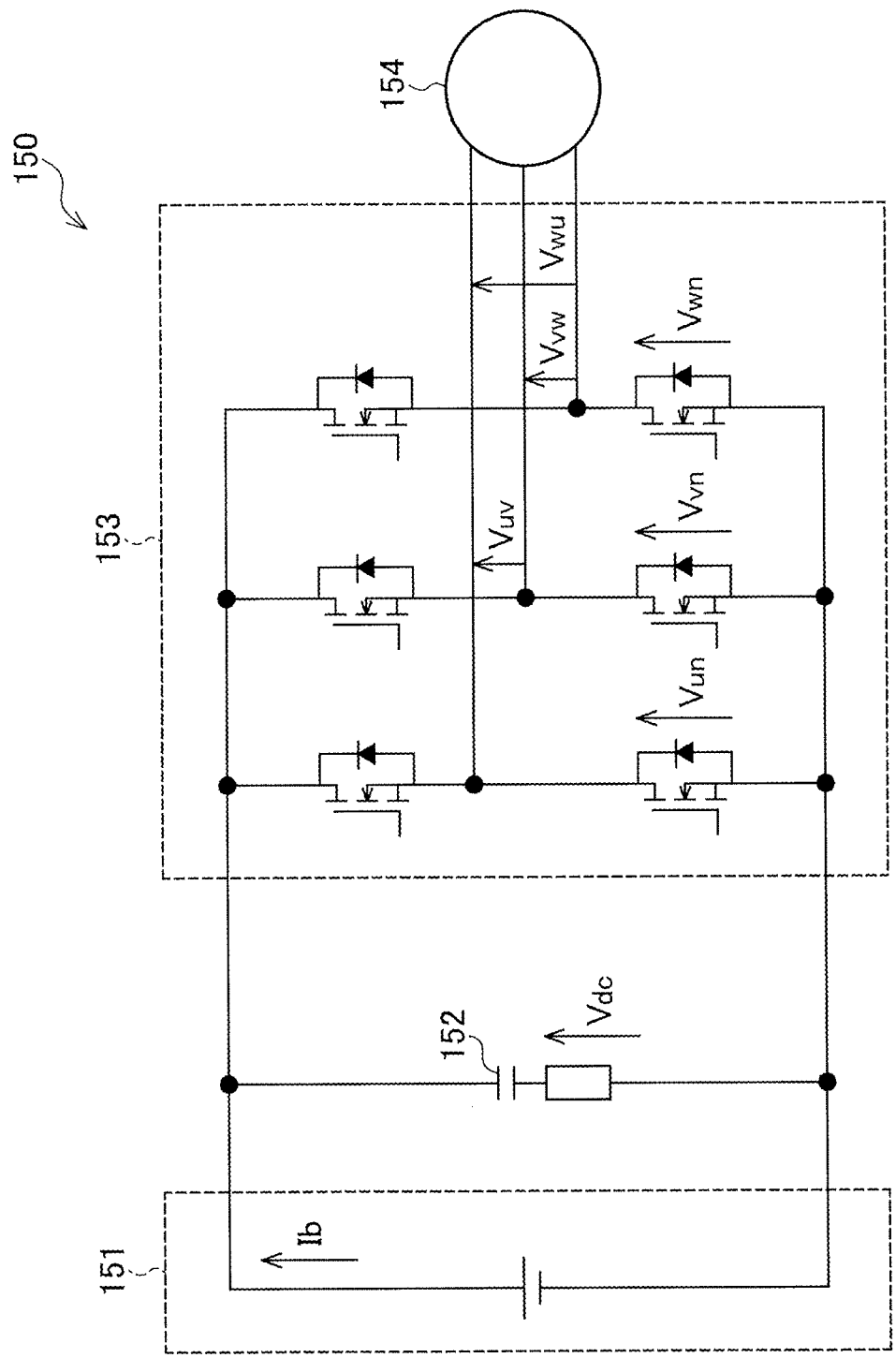
FIG. 3 is a schematic diagram representing a configuration example of a motor system.

The capacitor capacitance estimation device 100 performs the estimation in an equipment system. Electric equipment operating in the equipment system is equipment that operates by receiving the supply of AC voltage from the inverter, such as an electric motor (motor), an uninterruptible power supply device, a discharge lamp ballast, an induction heating high-frequency power generator or a high-frequency power generator, for example. In this embodiment, the description will be given by taking a motor as an example of the electric equipment. The capacitor capacitance estimation device 100 performs the estimation in a motor system 150 as shown in FIG. 3.

The motor system 150 includes a power supply 151 that outputs DC voltage, a capacitor 152 that smoothes the DC voltage, an inverter 153 that receives the supply of the smoothed DC voltage and generates variable frequency AC voltage, and a motor 154 that is driven by receiving the supply of the AC voltage.

Here, the power supply 151 may either output DC voltage or convert AC voltage into DC voltage by using a rectifier.

Incidentally, the motor 154 generates motive power and supplies the motive power to non-illustrated equipment.

In the following, a description will be given of a concrete operation of the capacitor capacitance estimation device 100 estimating the capacitance of the capacitor 152 which is part of the motor system 150.

The capacitor capacitance estimation device 100 estimates the capacitance of the capacitor 152 based on end-to-end voltage Vdc of the capacitor 152.

The load fluctuation cycle acquisition unit 101 acquires the load fluctuation cycle as the cycle of the fluctuation in the load on the motor 154.

As the simplest method of acquiring the load fluctuation cycle, it is possible to previously measure or calculate the load fluctuation cycle of the motor 154 by performing a process which will be described later, store the load fluctuation cycle in the load fluctuation cycle storage unit 102 for later use, and read out the stored value of the load fluctuation cycle. Alternatively, it is also possible for the load fluctuation cycle acquisition unit 101 to periodically execute a process of calculating the load fluctuation cycle and update the load fluctuation cycle stored in the load fluctuation cycle storage unit 102 when necessary.

In the case where the load fluctuation cycle is previously stored and the stored load fluctuation cycle is not updated, the calculation cost can be reduced since the designing of the filter is required only once at the beginning and subsequent designing processes are unnecessary.

In contrast, in the case where the load fluctuation cycle is calculated periodically and the stored load fluctuation cycle is updated, the calculation cost increases; however, the fluctuation in the time-series data of the carrier frequency components due to the load can be removed more precisely since the load fluctuation cycle according to the actual operational status of the equipment can be acquired.

Figure 4:
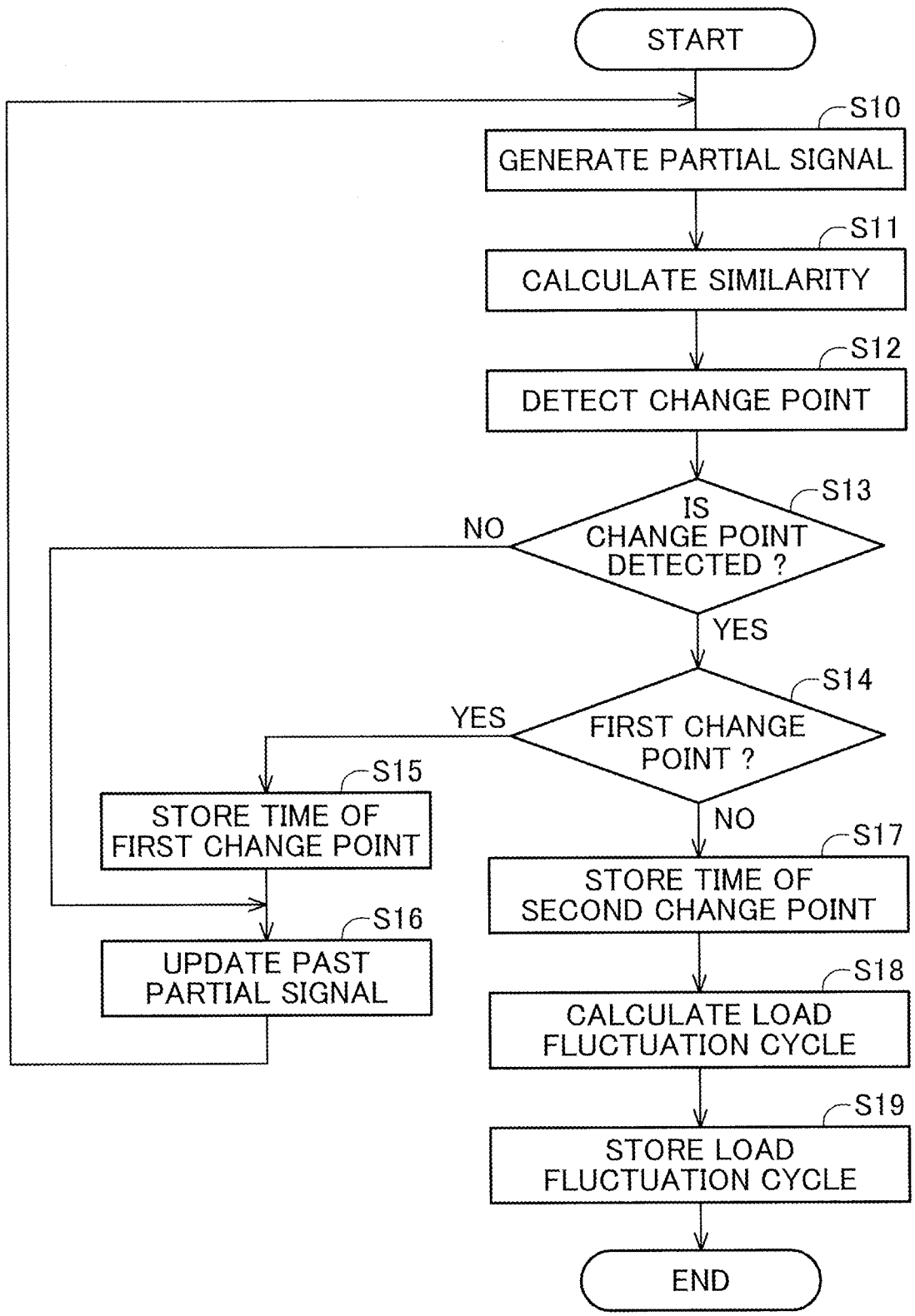
FIG. 4 is a flowchart representing an operation of calculating a load fluctuation cycle.

FIG. 4 is a flowchart representing the operation of calculating the load fluctuation cycle.

The load fluctuation cycle acquisition unit 101 generates a partial signal by segmenting the input signal at constant time intervals (S10).

The load fluctuation cycle acquisition unit 101 calculates similarity between the generated partial signal and a past partial signal as the partial signal generated one time interval earlier (S11).

The load fluctuation cycle acquisition unit 101 detects a change point of the input signal by judging the calculated similarity by using a threshold value (S12). Specifically, the load fluctuation cycle acquisition unit 101 detects that a change point appears in the input signal when the calculated similarity decreases below a predetermined value (threshold value).

The load fluctuation cycle acquisition unit 101 judges whether or not a change point is detected (S13). The process proceeds to step S14 when a change point is detected (Yes in S13); the process proceeds to step S16 when no change point is detected (No in S13).

In the step S14, the load fluctuation cycle acquisition unit 101 judges whether or not the detected change point is a first change point as a change point appearing first. The process proceeds to step S15 when the detected change point is the first change point (Yes in S14); the process proceeds to step S17 when the detected change point is not the first change point (No in S14).

In the step S15, the load fluctuation cycle acquisition unit 101 stores first time information indicating first time as time when the first change point was detected. Then, the process proceeds to the step S16.

In the step S16, the load fluctuation cycle acquisition unit 101 updates the past partial signal. Specifically, the load fluctuation cycle acquisition unit 101 updates the past partial signal to the partial signal generated in the step S10. Then, the process returns to the step S10.

In contrast, in the step S17, in the case where the detected change point is not the first change point, the detected change point is a second change point as a change point appearing second, and thus the load fluctuation cycle acquisition unit 101 stores second time information indicating second time as time when the second change point was detected.

Then, the load fluctuation cycle acquisition unit 101 calculates the load fluctuation cycle from the difference between the first time indicated by the first time information and the second time indicated by the second time information (S18).

The load fluctuation cycle acquisition unit 101 stores the calculated load fluctuation cycle in the load fluctuation cycle storage unit 102 (S19).

As above, the load fluctuation cycle acquisition unit 101 is capable of acquiring the load fluctuation cycle based on a fluctuation period, as a period in which the load fluctuates, by detecting the change points of the input signal.

Figure 5:
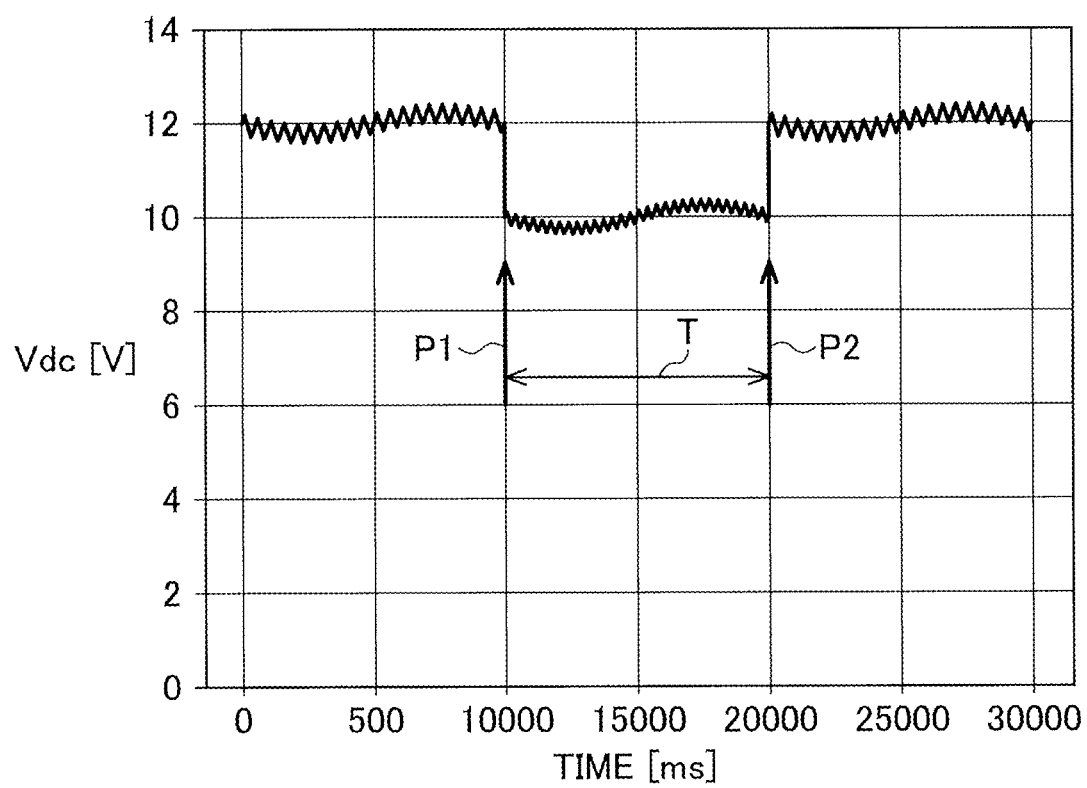
FIG. 5 is a schematic diagram representing an example of the load fluctuation cycle.

FIG. 5 is a schematic diagram representing an example of the load fluctuation cycle.

When the input signal inputted to the load fluctuation cycle acquisition unit 101 and indicating the end-to-end voltage Vdc of the capacitor 152 is obtained as shown in FIG. 5, the load fluctuation cycle acquisition unit 101 determines the period T between the first change point P1 and the second change point P2 and acquires the period T as the load fluctuation cycle.

Incidentally, in the step S19, when the load fluctuation cycle calculated in the step S18 is longer than the load fluctuation cycle already stored in the load fluctuation cycle storage unit 102, the load fluctuation cycle acquisition unit 101 is desired to update the load fluctuation cycle already stored in the load fluctuation cycle storage unit 102 to the load fluctuation cycle calculated in the step S18. Making such updates enables the load fluctuation removal filter application unit 108 to remove the fluctuation in the time-series data of the carrier frequency components due to all loads.

While the load fluctuation cycle acquisition unit 101 in the flowchart shown in FIG. 4 performs the calculation of the similarity in the step S11 by using dynamic time warping (DTW) algorithm, the calculation of the similarity may be performed by using other algorithm.

For example, the load fluctuation cycle acquisition unit 101 may detect the change points by using cross-correlation between the partial signal and the past partial signal.

It is also possible for the load fluctuation cycle acquisition unit 101 to detect a change degree by using singular spectrum transformation, which evaluates distance between subspaces aggregating a plurality of partial signals generated along a time series, and judge that a change point is detected when the change degree exceeds a predetermined value.

Incidentally, while the calculation of the load fluctuation cycle is performed only once in the example shown in FIG. 4, the load fluctuation cycle acquisition unit 101 may perform the load fluctuation cycle calculation process repeatedly, update the value of the load fluctuation cycle, and thereby acquire the load fluctuation cycle in accordance with the equipment.

The load fluctuation cycle mentioned here means, in the case of automobiles, a change time of steering torque occurring when the steering wheel is turned to go around a curve, for example, and in the case of metallic component processing machines, a time for which the machine makes contact with metal and places a load on the metal to process the metal, for example.

Figure 6A:
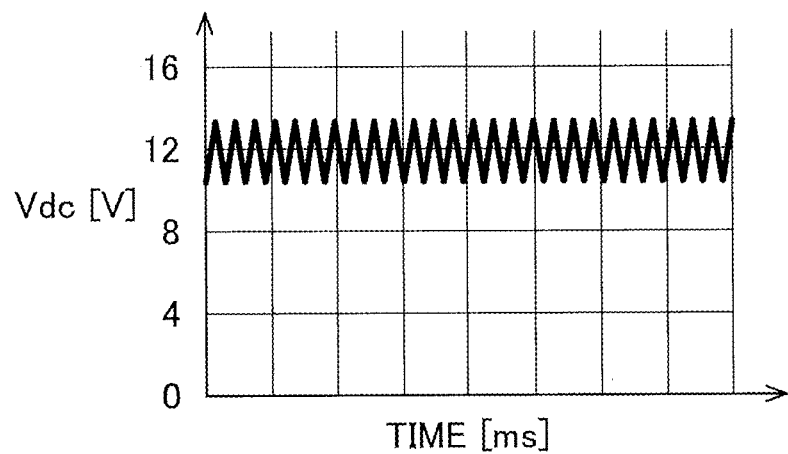
FIGS. 6A and 6B are explanatory drawings representing a method for obtaining the load fluctuation cycle.
Figure 6B:
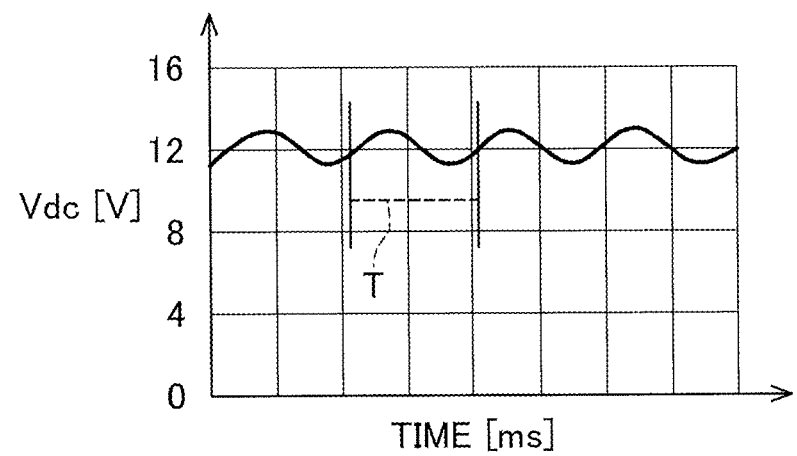

Besides such load fluctuations in which the magnitude of the load changes at constant time intervals as in the above examples, there are also cases where there occurs a pulsating load as a load pulsating periodically according to the rotation of the motor 154 and the operation of equipment connected to the motor 154. In such cases, the load fluctuation cycle acquisition unit 101 obtains the period T of the pulsating load after removing the carrier frequency components from the input signal by applying a lowpass filter to the input signal as shown in FIG. 6A and FIG. 6B.

Figure 7:
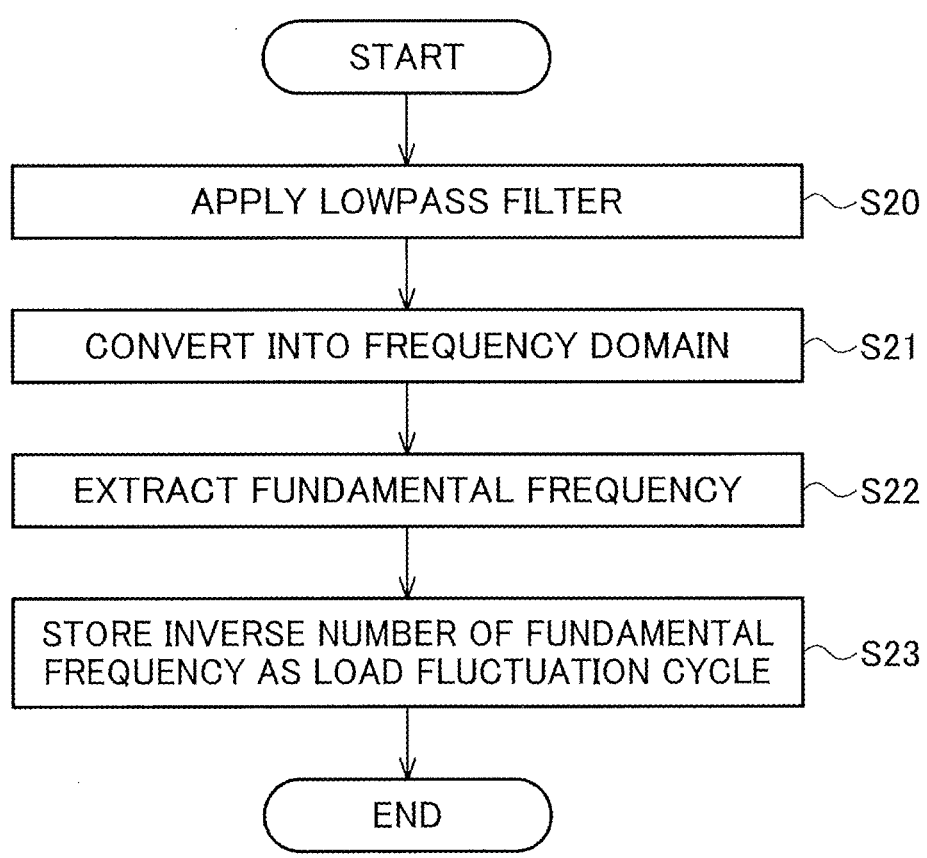
FIG. 7 is a flowchart representing an operation of calculating a cycle of a pulsating load.

FIG. 7 is a flowchart representing an operation of calculating the cycle of a pulsating load.

The load fluctuation cycle acquisition unit 101 removes the carrier frequency components from the input signal by applying a lowpass filter to the input signal (S20).

The load fluctuation cycle acquisition unit 101 converts the input signal after the application of the lowpass filter into the frequency domain (S21).

The load fluctuation cycle acquisition unit 101 extracts a fundamental frequency from the converted signal after the conversion into the frequency domain (S22).

Then, the load fluctuation cycle acquisition unit 101 acquires the inverse number of the fundamental frequency as the load fluctuation cycle and stores the acquired load fluctuation cycle in the load fluctuation cycle storage unit 102 (S23).

Here, the load fluctuation cycle acquisition unit 101 may also be configured to acquire the load fluctuation cycle from the similarity of the input signal similarly to the flowchart shown in FIG. 4 instead of acquiring the load fluctuation cycle from the fundamental frequency in regard to the input signal after the application of the lowpass filter. In this case, the load fluctuation cycle acquisition unit 101 calculates a period in which the similarity of the partial signal becomes the highest as the load fluctuation cycle instead of calculating the load fluctuation cycle from the time difference between two change points.

The load fluctuation removal filter design unit 103 designs the filter which the load fluctuation removal filter application unit 108 applies to the time-series data supplied from the carrier frequency component extraction unit 107, based on the load fluctuation cycle provided from the load fluctuation cycle acquisition unit 101. The designed filter is used for removing the fluctuation in the time-series data due to the fluctuation in the load on the motor 154. Therefore, the load fluctuation removal filter design unit 103 designs a lowpass filter for removing components of a load fluctuation frequency that is the inverse of the load fluctuation cycle, and supplies the load fluctuation removal filter application unit 108 with filter information indicating the lowpass filter. For example, it is desirable to design the lowpass filter so that the load fluctuation frequency may be included in the stopband.

Incidentally, when there is no change in the load fluctuation cycle provided from the load fluctuation cycle acquisition unit 101, the load fluctuation removal filter design unit 103 may supply the previously obtained filter information directly to the load fluctuation removal filter application unit 108 without newly designing a filter. By this method, the calculation cost for the designing of the filters can be reduced.

In contrast, in cases where the load fluctuation cycle acquisition unit 101 successively updates the load fluctuation cycle, the load fluctuation removal filter design unit 103 is desired to redesign the filter upon each change in the load fluctuation cycle. According to this method, even when the load fluctuation cycle changes, a filter adapted to the change can be constructed and the load fluctuation removal filter application unit 108 in the subsequent stage is enabled to more precisely remove the fluctuation due to the load from the time-series data of the carrier frequency components.

The section signal acquisition unit 104 stores the input signal in the section signal storage unit 105 and acquires, as the section signal, a signal corresponding to the length of the time interval of estimating the capacitance of the capacitor from the stored signal. The acquired section signal is supplied to the frequency domain conversion unit 106. The time interval used for acquiring the section signal may also be a constant time determined on the basis of the real time. Further, in consideration of the frequency conversion performed in the subsequent stage, the time interval may also be a time interval that equals a multiple of a power of two in a unit of the sampling time of the end-to-end voltage Vdc of the capacitor 152 indicated by the input signal.

The frequency domain conversion unit 106 converts the section signal supplied from the section signal acquisition unit 104 into the frequency domain. Short-time Fourier transform is used for the conversion into the frequency domain.

Figure 8A:
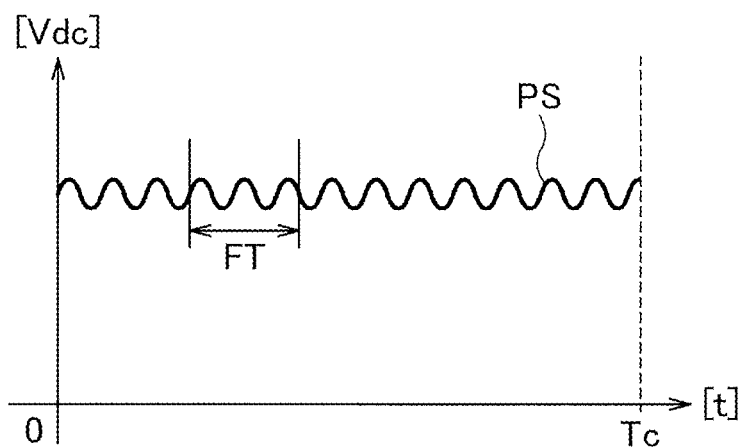
FIGS. 8A to 8C are explanatory drawings representing a method for obtaining a three-dimensional frequency spectrogram from a section signal.

Specifically, the frequency domain conversion unit 106 segments the section signal PS of the time interval Tc into a plurality of frames each having constant duration FT as shown in FIG. 8A. Incidentally, the horizontal axis in FIG. 8A represents time (t) and the vertical axis represents the capacitor end-to-end voltage (Vdc).

Figure 8B:
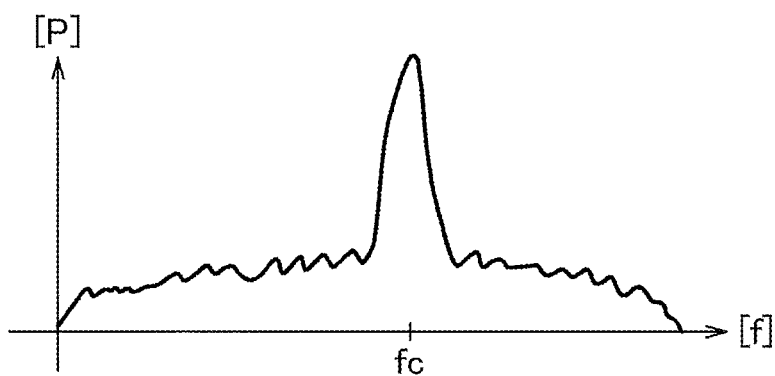

Then, the frequency domain conversion unit 106 calculates the component value of each frequency by applying Fourier transform to each frame as shown in FIG. 8B. The horizontal axis in FIG. 8B represents the frequency (f) and the vertical axis represents the component value (p). The component value in this example is a frequency spectrum.

Figure 8C:
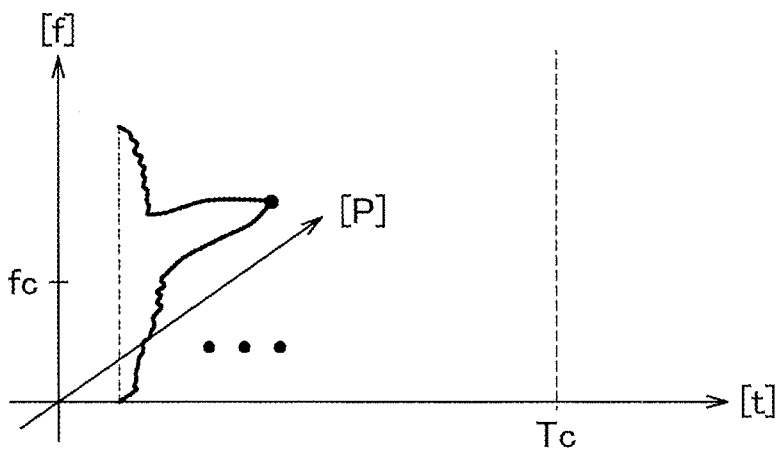

Further, as shown in FIG. 8C, the frequency domain conversion unit 106 generates a three-dimensional frequency spectrogram made up by times, frequency values and component values and supplies the frequency spectrogram to the carrier frequency component extraction unit 107.

Incidentally, in cases where FFT (Fast Fourier Transform) is used as the Fourier transform, for example, the duration FT for the segmentation into frames is desired to be set at duration corresponding to a power of two in a unit of the sampling time.

Further, in the segmentation of the section signal PS, it is also possible to perform the segmentation into frames so that each frame partially can overlap with a previous frame.

The carrier frequency component extraction unit 107 extracts component values corresponding to the carrier frequency component and its harmonic components from the frequency spectrogram supplied from the frequency domain conversion unit 106.

Specifically, the carrier frequency component extraction unit 107 extracts only component values whose frequency value is the carrier frequency or its integral multiple from the frequency spectrogram. Then, the carrier frequency component extraction unit 107 generates time-series data in which each extracted component value is associated with the corresponding frequency value, and supplies the time-series data to the load fluctuation removal filter application unit 108.

Figure 9:
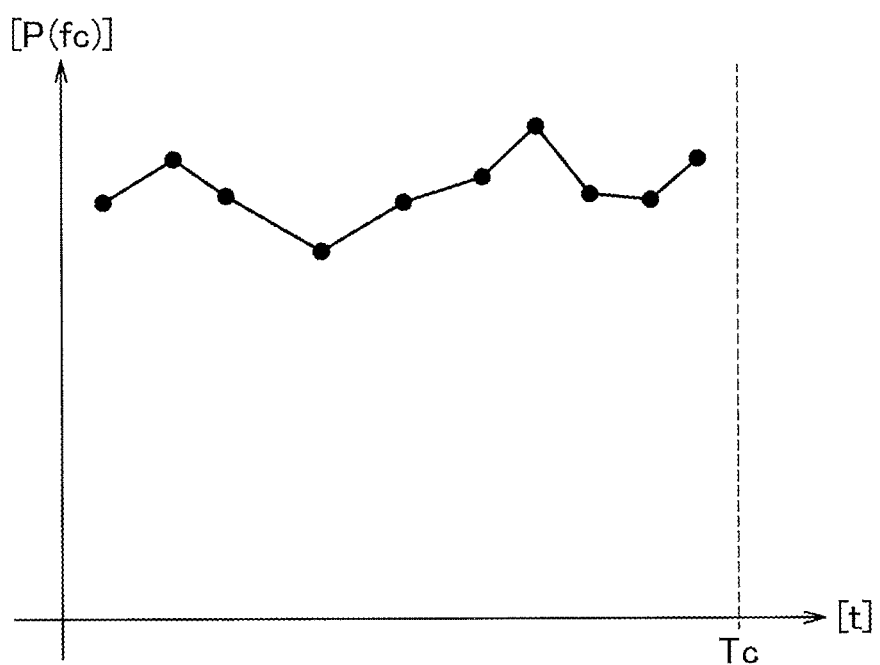
FIG. 9 is a schematic diagram representing an example of time-series data of a carrier frequency.

FIG. 9 is a schematic diagram representing an example of the time-series data of the carrier frequency fc.

As shown in FIG. 9, in the time-series data, component values of the carrier frequency fc are indicated according to a time series.

Incidentally, while the component values of only the carrier frequency and its harmonic components are considered in the above example, the carrier frequency component extraction unit 107 may also extract component values which have a certain frequency width and include those corresponding to vicinal frequency values as a multidimensional sequence. Depending on the combination condition of the carrier wave and the signal wave forming the PWM signal, there are cases where component values disappear in the harmonic components and appear in sideband waves. Thus, by extracting the component values with a certain degree of width, the carrier frequency component extraction unit 107 is capable of extracting component values indicating characteristics related to the carrier frequency without being affected by such differences in the configuration.

The load fluctuation removal filter application unit 108 uses the filter indicated by the filter information supplied from the load fluctuation removal filter design unit 103, to remove the fluctuation due to the load from the time-series data of the carrier frequency components supplied from the carrier frequency component extraction unit 107. For example, the load fluctuation removal filter application unit 108 may apply a lowpass filter to a signal corresponding to the time-series data. This makes it possible to remove short-term fluctuation due to the load fluctuation from the feature values used by the capacitor capacitance estimation unit 110 in the estimation of the capacitance and to extract exclusively the fluctuation due to the capacitance deterioration of the capacitor 152. Accordingly, the capacitor capacitance estimation unit 110 is capable of performing the estimation of the capacitance with high accuracy.

The capacitance estimation model storage unit 109 stores a capacitance estimation model for estimating the capacitance of the capacitor 152. As an estimator, algorithm called support vector machine regression, for example is used. The support vector machine regression is a method that applies algorithm named a support vector machine, which is based on the idea of maximizing the distance between two classes by using support vectors when learning a separating plane for discriminating between the two classes, to a regression problem. Then, the capacitance estimation model storage unit 109 stores, for example, information on the estimation model learned and constructed by using the support vector machine regression algorithm, that is, information on support vectors as samples necessary for forming the regression hyperplane or information on regression coefficient parameters of an expression representing the regression plane.

Specifically, by learning the regression plane by using support vector machine regression or the like, an estimation function expression represented by the following expression (1) is obtained:

$$C=F(x) \tag{1}$$

Here, C represents an estimate value of the capacitance of the capacitor 152, F represents a function representing the learned regression plane, and x represents a feature value.

The information on the estimation model is information for forming the aforementioned function F.

For example, when the function F is an n-th order function (n: integer larger than or equal to two), coefficients of the following expression (2) are the information on the estimation model:

$$F=a\_0+a\_1 \times x+a\_2 \times x^2+a\_3 \times x^3+\ldots+a\_n \times x^n \tag{2}$$

Incidentally, the coefficients are a_0, a_1, a_2, a_3, . . . and a_n.

Further, other information such as information on support vectors necessary for reconstructing the regression plane (regression curve) is also stored as the information on the estimation model.

The capacitor capacitance estimation unit 110 is a capacitor capacitance determination unit that determines (estimates) the capacitance of the capacitor 152 by using, as the feature values, the values constituting the time-series data of the carrier frequency after the application of the filter supplied from the load fluctuation removal filter application unit 108. For example, the capacitor capacitance estimation unit 110 estimates the capacitance of the capacitor 152 from the feature values by using the capacitance estimation model stored in the capacitance estimation model storage unit 109.

Incidentally, in this example, a value obtained by averaging values constituting the time-series data of the carrier frequency after the application of the filter is used as a feature value.

Figure 10:
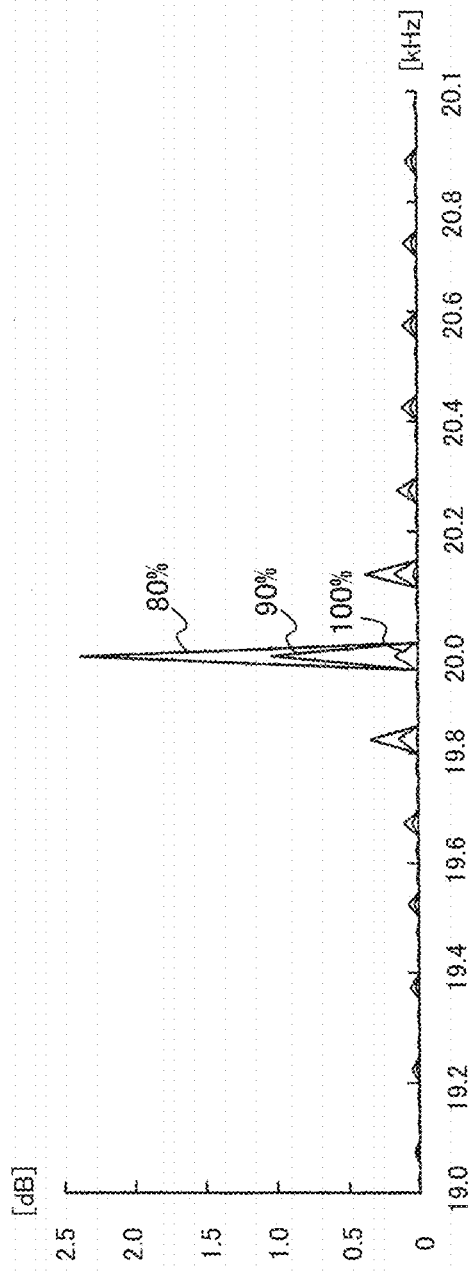
FIG. 10 is a graph representing difference in component values of the carrier frequency with respect to changes in capacitance of a capacitor.

FIG. 10 is a graph representing difference in the component values of the carrier frequency with respect to changes in the capacitance of the capacitor.

The horizontal axis in FIG. 10 represents the frequency and the vertical axis in FIG. 10 represents the component value (unit: dB) at each frequency. FIG. 10 excerpts component values in the vicinity of the frequency of 20 kHz and shows the component values in cases where the capacitance of the capacitor 152 is 100%, 90% and 80%.

As shown in FIG. 10, the component values of the carrier frequency of the capacitor end-to-end voltage Vdc have the tendency to increase with the decrease in the capacitance of the capacitor 152.

Figure 11:
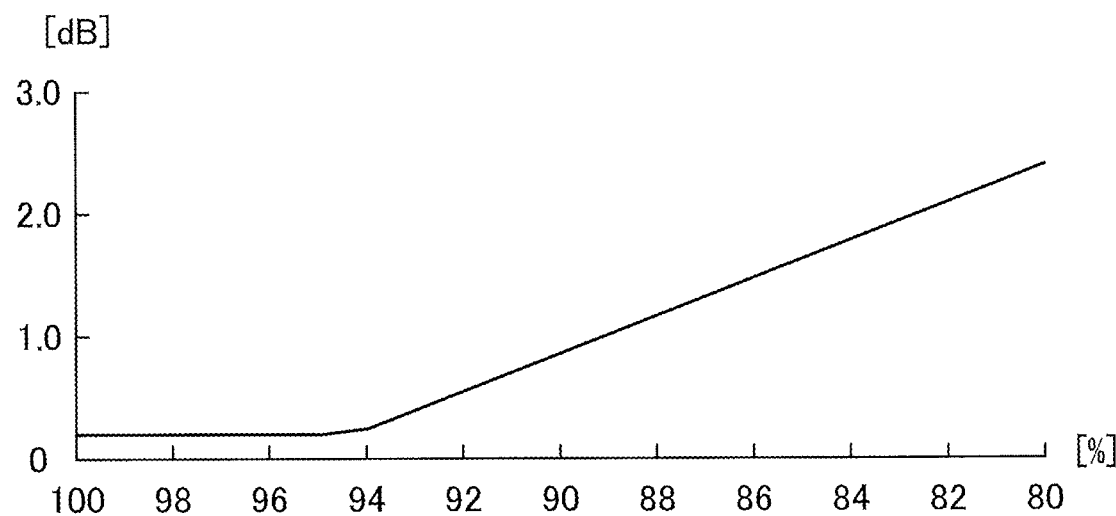
FIG. 11 is a graph representing the relationship between the capacitance of the capacitor and the component value of the carrier frequency.

FIG. 11 is a graph representing the relationship between the capacitance of the capacitor 152 and the component value of the carrier frequency.

The horizontal axis in FIG. 11 represents the capacitance of the capacitor 152 and the vertical axis in FIG. 11 represents the component value (unit: dB) at each capacitance.

As shown in FIG. 11, it can be confirmed that the component value of the carrier frequency monotonically increases with the decrease in the capacitance of the capacitor 152.

According to the description above, the capacitor capacitance estimation unit 110 is configured to estimate the capacitance of the capacitor 152 so that the capacitance of the capacitor 152 can decrease with the increase in the feature value determined by the values constituting the time-series data of the carrier frequency after the application of the filter.

Incidentally, in the estimation of the capacitance of the capacitor 152, the capacitor capacitance estimation unit 110 may also be configured to successively update the estimation model by incorporating the framework of reinforcement learning so that errors in the detection result can be corrected during the operation of the equipment.

In the learning, the capacitor capacitance estimation unit 110 learns the regression plane by using the feature value excluding the fluctuation due to the load supplied from the load fluctuation removal filter application unit 108 and the capacitance of the capacitor 152 as label data, and stores the result of the learning in the capacitance estimation model storage unit 109.

Incidentally, while the description here has been given by taking the estimation by means of support vector machine regression as an example, it is also possible to use other algorithm such as simple regression analysis, multiple regression analysis, or regression by means of neural network or deep learning.

The deterioration of the capacitor 152 is influenced by not only the status of use but also surrounding environment such as temperature or humidity, for example. Constructing the estimation model by using the framework of machine learning has an advantage in that the estimation model can be flexibly expanded for nonlinear systems since information regarding the environment can be added as feature values, for example.

The capacitance estimation result outputted by the capacitor capacitance estimation unit 110 may either be successively outputted upon each estimation or outputted as the median value or the mean value of a certain number of consecutive estimation results. By outputting the estimation result based on a plurality of estimation results, influence of temporary estimation errors can be reduced.

As described above, the capacitor capacitance estimation device 100 according to the first embodiment is capable of estimating the capacitance of the capacitor 152 based exclusively on the end-to-end voltage Vdc of the smoothing capacitor 152. For the estimation of the capacitance, instead of directly handling the voltage waveform, the capacitor capacitance estimation device 100 converts the voltage waveform into the frequency domain, thereby extracts the carrier frequency components, and uses the extracted carrier frequency components as feature values. Further, the capacitor capacitance estimation device 100 acquires the load fluctuation cycle of the motor 154 from the end-to-end voltage Vdc of the capacitor 152 and removes the fluctuation in the feature values based on the acquired load fluctuation cycle. Accordingly, capacitance estimation with high accuracy becomes possible.

An automobile control system or an FA system including the capacitor capacitance estimation device 100 according to the first embodiment is capable of monitoring the capacitance of the capacitor 152 on a real-time basis even when the equipment is in operation. Thus, it is unnecessary to stop the equipment in order to measure the capacitance of the capacitor 152, and accordingly, when the first embodiment is applied to an automobile control system, for example, failure occurring during the traveling of the automobile can be prevented. When the first embodiment is applied to an FA system, the availability factor of the FA system can be increased. Further, since accurate capacitance is acquired during the operation, appropriate timing of maintenance can be set. Accordingly, maintenance costs of the capacitor 152 and the equipment can be reduced significantly.

Furthermore, since the information necessary for estimating the capacitance of the capacitor 152 is only the end-to-end voltage Vdc of the capacitor 152 and the acquisition of the information is easy even from already existing equipment, there is another advantage in that the capacitor capacitance estimation device 100 can be easily added to already existing equipment with virtually no need of modifying the configuration of the equipment.

Second Embodiment

Ripple components of the carrier frequency of PWM control appear also in power supply current.

Therefore, a signal representing the power supply current is inputted as the input signal to a capacitor capacitance estimation device 200 according to a second embodiment shown in FIG. 1.

For example, in the motor system 150 like the one shown in FIG. 3, the input signal representing the power supply current Ib is inputted to the capacitor capacitance estimation device 200 according to the second embodiment instead of the end-to-end voltage Vdc of the capacitor 152.

Incidentally, in the case where a signal representing the power supply current Ib is used as the input signal, a resistor for measurement is added in series to the circuit in order to measure current, and the power supply current Ib is measured by measuring end-to-end voltage of the resistor.

Third Embodiment

The ripple components of the carrier frequency of PWM control appear also in phase voltages and line-to-line voltages of the inverter.

Therefore, a signal representing line-to-line voltage of the inverter is inputted to a capacitor capacitance estimation device 300 according to a third embodiment shown in FIG. 1 as the input signal.

For example, in the motor system 150 shown in FIG. 3, an input signal representing one of the phase voltages Vun, Vvn and Vwn of the inverter 153 is inputted to the capacitor capacitance estimation device 300 according to the third embodiment.

Incidentally, it is also possible to input an input signal representing one of the line-to-line voltages Vuv, Vvw and Vwu of the inverter 153 shown in FIG. 3 to the capacitor capacitance estimation device 300 instead of the end-to-end voltage Vdc of the capacitor 152.

While the capacitor capacitance estimation devices 100 to 300 extract feature values in the above-described first to third embodiments, the first to third embodiments are not limited to such examples.

For example, the capacitor capacitance estimation devices 100 to 300 may also be configured so that the processing regarding the extraction of the feature values such as the processing performed by the frequency domain conversion unit 106 and the carrier frequency component extraction unit 107 can be performed by the outside of the capacitor capacitance estimation devices 100 to 300, such as an external server, and the capacitor capacitance estimation devices 100 to 300 acquire the result of the processing by communication. This makes it possible to construct each of the capacitor capacitance estimation devices 100 to 300 even in cases where the calculation of the feature values or the estimation of the capacitance of the capacitor 152 requires a high calculation cost and cannot be implemented only by a RAM (Random Access Memory) or a ROM (Read Only Memory) installed in each of the capacitor capacitance estimation devices 100 to 300.

Figure 12:
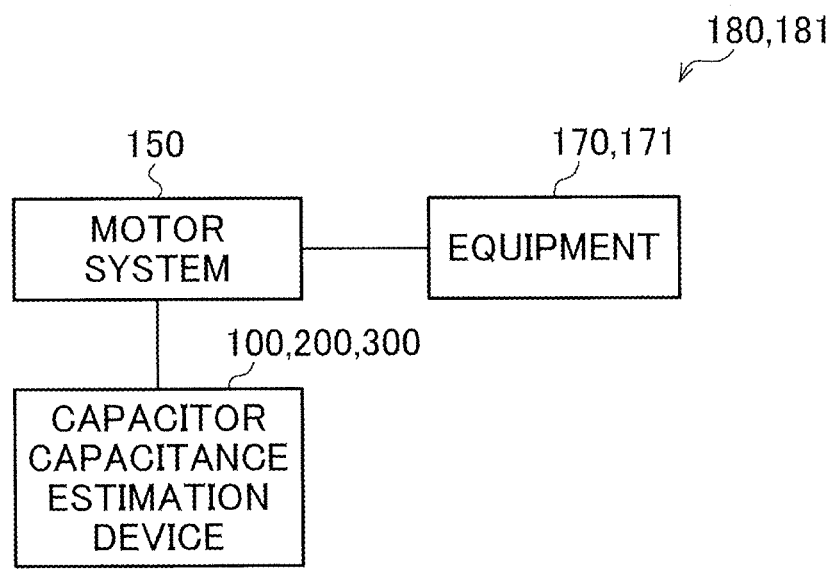
FIG. 12 is a block diagram representing an automobile control system or an FA system.

As shown in FIG. 12, an automobile control system 180 can be constructed by employing one of the capacitor capacitance estimation devices 100 to 300 according to the first to third embodiments, the motor system 150 shown in FIG. 3, and equipment 170 that performs operations with motive power obtained from the motor system 150. Here, the equipment 170 is an automated driving system that automatically operates the steering wheel or the like of an automobile, for example.

Further, as shown in FIG. 12, an FA system 181 can be constructed by employing one of the capacitor capacitance estimation devices 100 to 300 according to the first to third embodiments, the motor system 150 shown in FIG. 3, and equipment 171 that performs operations with motive power obtained from the motor system 150. Here, the equipment 171 is a production automation system that automatically performs an assembly process or the like, for example.

While the carrier frequency component extraction unit 107 in the above-described first to third embodiments extracts component values whose frequency is the carrier frequency or an integral multiple of the carrier frequency, the first to third embodiments are not limited to such examples.

For example, the carrier frequency component extraction unit 107 may also be configured to extract only a component value whose frequency is the carrier frequency.

DESCRIPTION OF REFERENCE CHARACTERS 100, 200, 300: capacitor capacitance estimation device, 101: load fluctuation cycle acquisition unit, 102: load fluctuation cycle storage unit, 103: load fluctuation removal filter design unit, 104: section signal acquisition unit, 105: section signal storage unit, 106: frequency domain conversion unit, 107: carrier frequency component extraction unit, 108: load fluctuation removal filter application unit, 109: capacitance estimation model storage unit, 110: capacitor capacitance estimation unit, 150: motor system, 151: power supply, 152: capacitor, 153: inverter, 154: motor

What is claimed is:

1. A capacitor capacitance estimation device configured to estimate capacitance of a capacitor in an equipment system including a power supply, the capacitor to smooth DC voltage from the power supply, an inverter to receive a supply of the smoothed DC voltage and to generate AC voltage, and electric equipment to operate by receiving a supply of the AC voltage, comprising:
processing circuitry
to generate a filter for removing influence of fluctuation based on a load fluctuation cycle that is a cycle of the fluctuation of a load placed on the electric equipment;
to acquire a section signal of a predetermined period from an input signal that includes a carrier frequency included in the AC voltage as a component, the carrier frequency being in sync with a pulse width modulation (PWM) signal for controlling the inverter;
to segment the section signal into a plurality of signals and to generate a plurality of pieces of frequency domain data by converting each of the plurality of signals obtained by the segmentation into a plurality of component values in a frequency domain, each of the plurality of signals having predetermined duration;
to extract a component value of a frequency corresponding to the carrier frequency from the plurality of component values in each of the plurality of pieces of frequency domain data, to use the extracted component value as a value at time corresponding to the corresponding one of the extracted signals, and to generate time-series data representing a plurality of the extracted component values in a time series;
to generate processed time-series data by applying the filter to the time-series data; and
to estimate the capacitance of the capacitor from the processed time-series data.

2. The capacitor capacitance estimation device according to claim 1, wherein the filter is a lowpass filter that removes components of frequencies corresponding to the load fluctuation cycle.

3. The capacitor capacitance estimation device according to claim 1, wherein the input signal is a signal representing capacitor voltage of the capacitor.

4. The capacitor capacitance estimation device according to claim 1, wherein the input signal is a signal representing power supply current from the power supply.

5. The capacitor capacitance estimation device according to claim 1, wherein the input signal is a signal representing phase voltage of the inverter.

6. The capacitor capacitance estimation device according to claim 1, wherein the input signal is a signal representing line-to-line voltage of the inverter.

7. The capacitor capacitance estimation device according to claim 1, wherein the processing circuitry
acquires a fluctuation period, as a period in which the load fluctuates, from the input signal and to successively update the load fluctuation cycle,
updates the filter upon each update of the load fluctuation cycle, and
updates the filter applied to the time-series data upon each update of the filter.

8. The capacitor capacitance estimation device according to claim 7, wherein the processing circuitry acquires the load fluctuation cycle by detecting a change point of the input signal.

9. The capacitor capacitance estimation device according to claim 7, wherein when the fluctuation period acquired from the input signal is longer than a period represented by the load fluctuation cycle, the processing circuitry updates the load fluctuation cycle so that the load fluctuation cycle represents the fluctuation period acquired from the input signal.

10. The capacitor capacitance estimation device according to claim 1, wherein the processing circuitry estimates the capacitance of the capacitor so that the capacitance of the capacitor decreases with an increase in a feature value determined from the processed time-series data.

11. A control system comprising a motor system, equipment to operate by receiving a supply of motive power from the motor system, and a capacitor capacitance estimation device, wherein the motor system includes:

a power supply;

a capacitor to smooth DC voltage from the power supply;

an inverter to receive a supply of the smoothed DC voltage and to generate AC voltage; and a motor to be driven by receiving a supply of the AC voltage, and the capacitor capacitance estimation device includes:

processing circuitry to generate a filter for removing influence of fluctuation based on a load fluctuation cycle that is a cycle of the fluctuation of a load placed on the motor;

to acquire a section signal of a predetermined period from an input signal that includes a carrier frequency included in the AC voltage as a component, the carrier frequency being in sync with a pulse width modulation (PWM) signal for controlling the inverter;

to segment the section signal into a plurality of signals and to generate a plurality of pieces of frequency domain data by converting each of the plurality of signals obtained by the segmentation into a plurality of component values in a frequency domain, each of the plurality of signals having predetermined duration;

to extract a component value of a frequency corresponding to the carrier frequency from the plurality of component values in each of the plurality of pieces of frequency domain data, to use the extracted component value as a value at time corresponding to the corresponding one of the extracted signals, and to generate time-series data representing a plurality of the extracted component values in a time series;

to generate processed time-series data by applying the filter to the time-series data; and to estimate the capacitance of the capacitor from the processed time-series data.

12. A capacitor capacitance estimation method of estimating capacitance of a capacitor in an equipment system including a power supply, the capacitor to smooth DC voltage from the power supply, an inverter to receive a supply of the smoothed DC voltage and to generate AC voltage, and electric equipment to operate by receiving a supply of the AC voltage, comprising:

generating a filter for removing influence of fluctuation based on a load fluctuation cycle that is a cycle of the fluctuation of a load placed on the electric equipment;

acquiring a section signal of a predetermined period from an input signal that includes a carrier frequency included in the AC voltage as a component, the carrier frequency being in sync with a pulse width modulation (PWM) signal for controlling the inverter;

segmenting the section signal into a plurality of signals and generating a plurality of pieces of frequency domain data by converting each of the plurality of signals obtained by the segmentation into a plurality of component values in a frequency domain, each of the plurality of signals having predetermined duration;

extracting a component value of a frequency corresponding to the carrier frequency from the plurality of component values in each of the plurality of pieces of frequency domain data, using the extracted component value as a value at time corresponding to the corresponding one of the extracted signals, and generating time-series data representing a plurality of the extracted component values in a time series;

generating processed time-series data by applying the filter to the time-series data; and estimating the capacitance of the capacitor from the processed time-series data.

\* \* \* \* \*